United States Patent
Chen et al.

(10) Patent No.: US 8,031,160 B2
(45) Date of Patent: Oct. 4, 2011

(54) SHIFT REGISTER, SHIFT REGISTER ARRAY, AND FLAT DISPLAY APPARATUS

(75) Inventors: Jing Ru Chen, Hsinchu (TW); Lee Hsun Chang, Hsinchu (TW); Shyh-Feng Chen, Hsinchu (TW); Chun-Jong Chang, Hsinchu (TW); Yung-Tse Cheng, Hsinchu (TW)

(73) Assignee: AU Optronics Corp., Hsinchu (TW)

( * ) Notice: Subject to any disclaimer, the term of this patent is extended or adjusted under 35 U.S.C. 154(b) by 897 days.

(21) Appl. No.: 11/777,678

(22) Filed: Jul. 13, 2007

(65) Prior Publication Data
US 2008/0068326 A1 Mar. 20, 2008

(30) Foreign Application Priority Data
Sep. 14, 2006 (TW) ................................ 95134023 A

(51) Int. Cl.
*G09G 3/36* (2006.01)
(52) U.S. Cl. ............... 345/100; 345/98; 377/64; 377/72
(58) Field of Classification Search .................. 345/100, 345/98, 99, 92; 377/64, 72, 78
See application file for complete search history.

(56) References Cited

U.S. PATENT DOCUMENTS

| | | | | |
|---|---|---|---|---|
| 7,319,452 B2 * | 1/2008 | Moon | ........................... | 345/100 |
| 7,486,269 B2 * | 2/2009 | Moon | ........................... | 345/100 |
| 2004/0189585 A1 | 9/2004 | Moon | | |
| 2005/0083292 A1 | 4/2005 | Moon et al. | | |

* cited by examiner

*Primary Examiner* — Amare Mengistu
*Assistant Examiner* — Joseph G Rodriguez
(74) *Attorney, Agent, or Firm* — Thomas, Kayden, Horstemeyer & Risley, LLP

(57) ABSTRACT

A flat display apparatus comprising a shift register array is provided. The shift register array comprises a plurality of shift registers. At least one of these shift registers comprises a shift register unit, a first TFT, and a second TFT. The shift register unit is configured to receive an activation signal and comprises a first output terminal and a second output terminal. The gate of the first TFT is coupled to the first output terminal. The second electrode of the first TFT receives a clock signal. The gate of the second TFT is coupled to the first electrode of the first TFT. The second electrode of the second TFT is coupled to the second electrode of the first TFT. The first electrode of the second TFT is coupled to the second output terminal.

15 Claims, 9 Drawing Sheets

SHIFT REGISTER, SHIFT REGISTER ARRAY, AND FLAT DISPLAY APPARATUS

CROSS REFERENCE TO RELATED APPLICATION

This application claims priority to Taiwan Patent Application No. 095134023 filed on 14 Sep. 2006, the disclosure of which is incorporated herein by reference in its entirety.

BACKGROUND OF THE INVENTION

1. Field of the Invention

The present invention relates to a flat display apparatus, specifically to a shift register of a shift register array.

2. Descriptions of the Related Art

Currently, most Liquid Crystal Displays (LCD) are equipped with a gate driver and a source driver to generate a gate pulse signal and a data signal. However, due to the high cost of these drivers, alternative devices are proposed. For example, a shift register fabricated on a glass substrate with circuit functions equivalent to a gate driver, called integrated driving circuit, is one of the alternatives.

When applying the integrated driving circuit to a large sized liquid crystal display apparatus, a large amount of power is required. Consequently, a large sized Thin Film Transistor (TFT) is required at the output terminal of the shift register. Unfortunately, by using this approach, the output waveform of the shift register generates a coupling effect which causes the LCD to function abnormally.

FIG. 1 shows the architecture of a shift register 1 of the prior art. In this figure, CK represents a positive clock signal, XCK represents a negative clock signal, N−1 represents an input of the shift register 1, and N represents an output of the shift register. When the shift register 1 is applied to a large sized LCD, this design faces two serious defects. When the XCK signal rises, i.e. when the CK signal falls, the electric charge of the node P is released by the shift register 1, which causes a longer falling time of the output waveform N of the shift register 1. Referring to FIG. 2 of a timing diagram of the shift register 1, the dotted circle 21 and the dotted circle 22 indicate the rising of the XCK and the falling of the CK, respectively. At this moment, the electric charge of the node P drops immediately as shown in the dotted circle 23. FIG. 3 shows the output waveform of the shift register 1. According to the position indicated by the dotted circle 31, the falling time of the output waveform of the shift register 1 is about 12.4 µs. The falling time is too long for a LCD. Furthermore, when the size of the transistor 101 is enlarged, the coupling effect of the output terminal N becomes more significant, further causing erroneous operation of the next shift register, which considerably affects display quality.

According to the aforementioned problems and descriptions, the coupling effect and the long falling time of the output waveform are two common defects of current shift registers in LCDs. Consequently, designing a shift register to solve both problems remains an urgent topic of research.

SUMMARY OF THE INVENTION

The primary object of the present invention is to provide a shift register comprising a shift register unit, a first thin-film transistor (TFT) and a second TFT. The shift register unit has a first output terminal and a second output terminal and is configured to receive an activation signal. The first TFT has a gate, a first electrode, and a second electrode, wherein the gate of the first TFT is coupled to the first output terminal, and the second electrode of the first TFT is used for receiving a clock signal. The second TFT has a gate, a first electrode, and a second electrode, wherein the gate of the second TFT is coupled to the first electrode of the first TFT, the second electrode of the second TFT is coupled to the second electrode of the first TFT, and the first electrode of the second TFT is coupled to the second output terminal.

Another objective of this invention is to provide a shift register array, including a plurality of shift registers connecting in series. At least one of the shift register comprises a shift register unit, a first TFT and a second TFT. The shift register unit has a first output terminal and a second output terminal, and is used for receiving an activation signal. The first TFT has a gate, a first electrode, and a second electrode, wherein the gate of the first TFT is coupled to the first output terminal, and the second electrode of the first TFT is coupled to a clock signal. The second TFT has a gate, a first electrode, and a second electrode, wherein the gate of the second TFT is coupled to the first electrode of the first TFT, the second electrode of the second TFT is coupled to the second electrode of the first TFT, and the first electrode of the second TFT is coupled to the second output terminal.

Yet another objective of this invention is to provide a flat display apparatus comprising at least a display array and a shift register array. The display array has a plurality of pixels while the shift register array has a plurality of shift registers. Each of the shift registers is used for driving a row of pixels of the display array. At least one of the shift registers comprises a shift register unit, a first TFT and a second TFT. The shift register unit has a first output terminal and a second output terminal, and is used for receiving an activation signal. The first TFT has a gate, a first electrode, and a second electrode, wherein the gate of the first TFT is coupled to the first output terminal, and the second electrode of the first TFT is used for receiving a clock signal. The second TFT has a gate, a first electrode, and a second electrode, wherein the gate of the second TFT is coupled to the first electrode of the first TFT, the second electrode of the second TFT is coupled to the second electrode of the first TFT, and the first electrode of the second TFT is coupled to the second output terminal.

According to the aforementioned configuration, this invention can reduce the coupling effect generated by the clock signal at the output terminal of the shift register. In addition, the falling time of the output waveform is shortened.

The detailed technology and preferred embodiments implemented for the subject invention are described in the following paragraphs accompanying the appended drawings for those skilled in this field to well appreciate the features of the claimed invention.

DESCRIPTION OF THE PREFERRED EMBODIMENT

Figure 1:
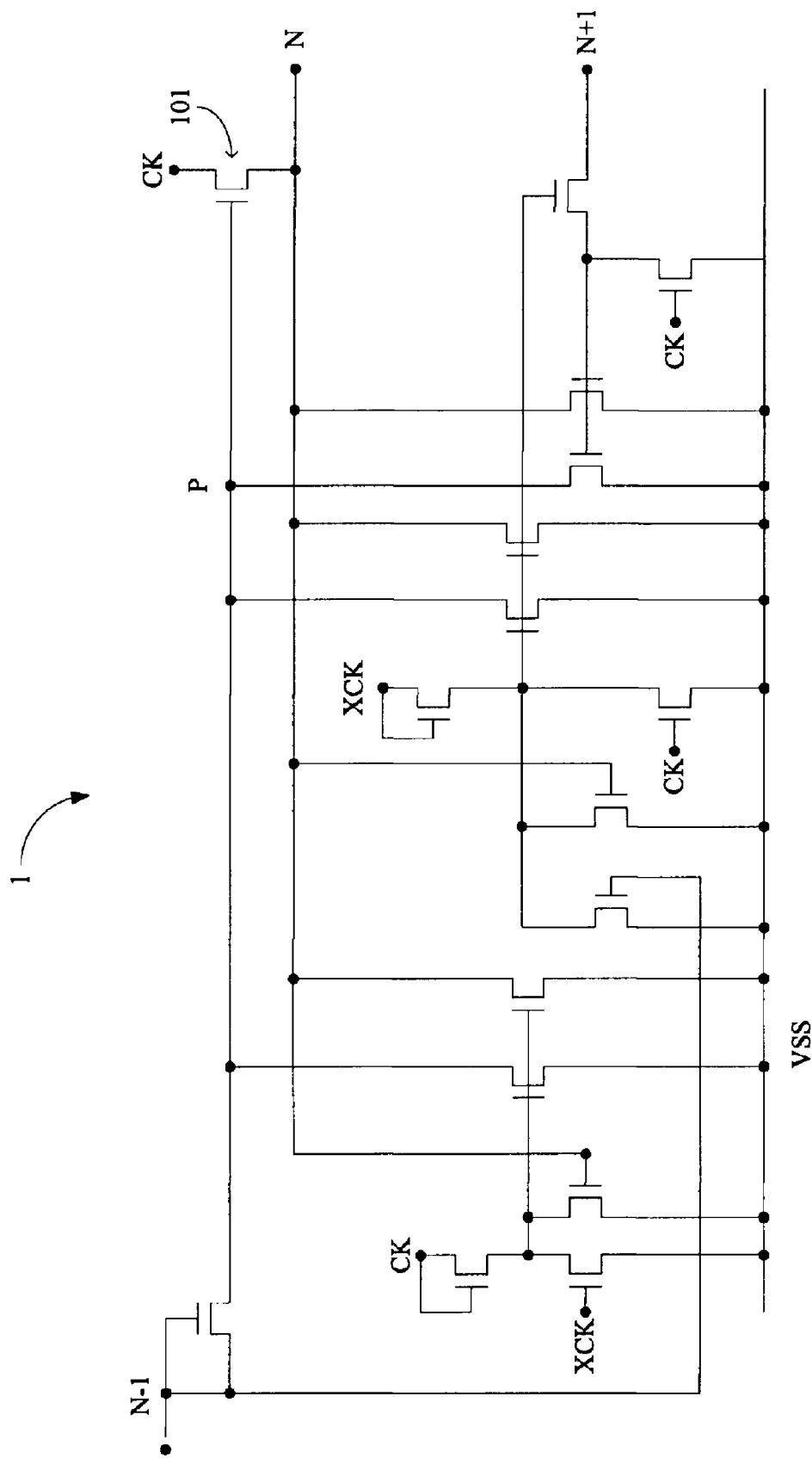
FIG. 1 is a schematic diagram of a prior art shift register.
Figure 2:
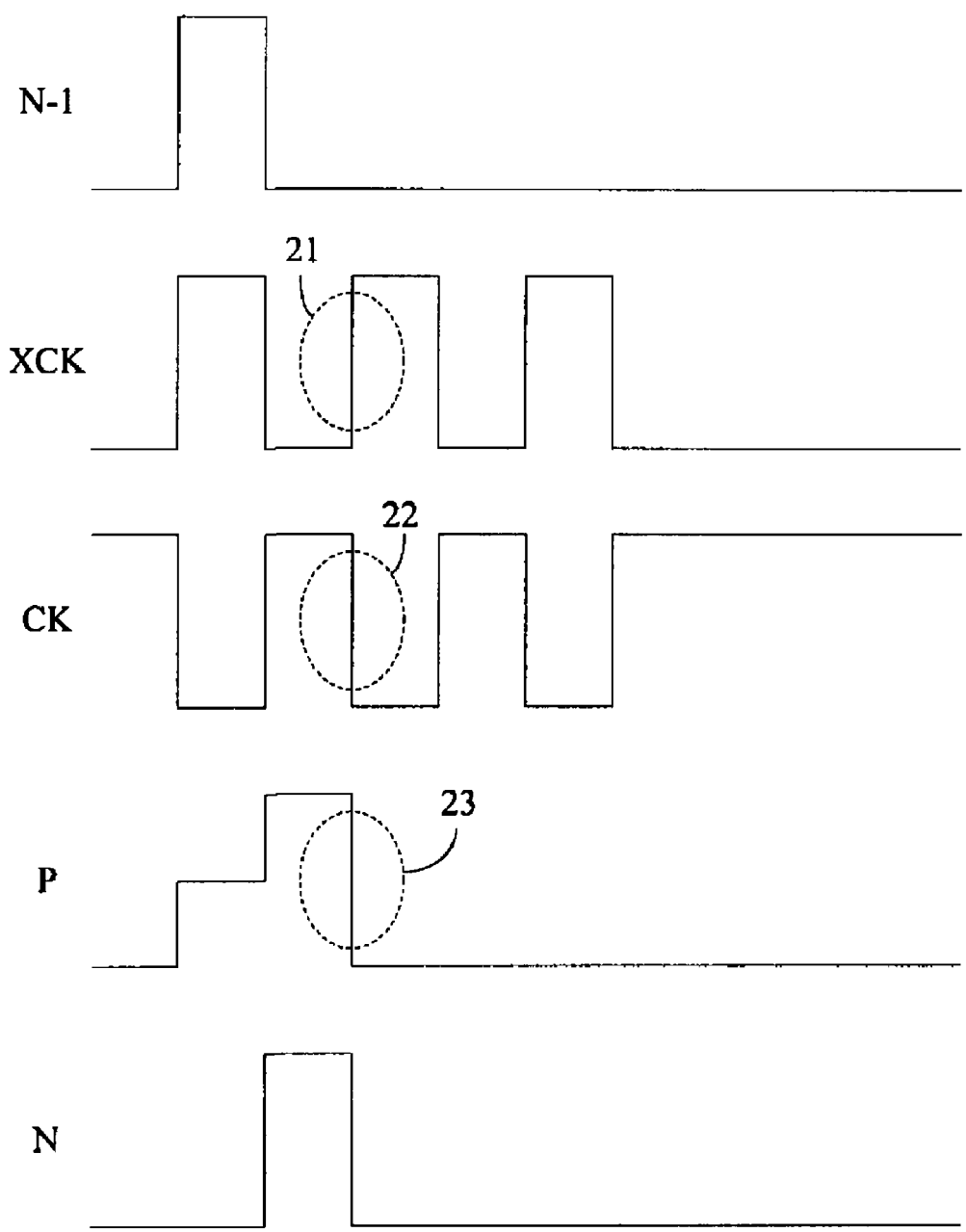
FIG. 2 is a timing diagram of FIG. 1.
Figure 3:
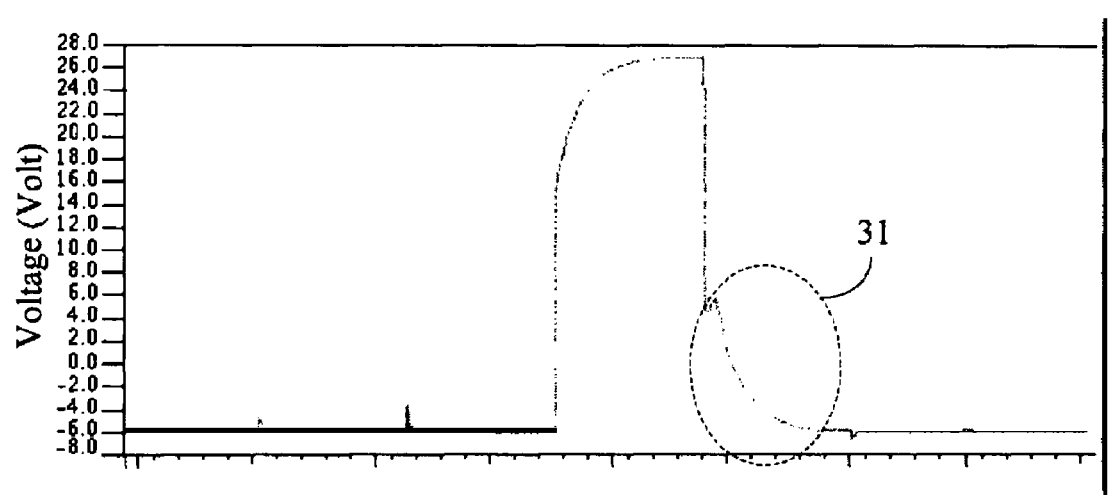
FIG. 3 is a diagram of an output waveform of a shift register of FIG. 1.
Figure 4A:
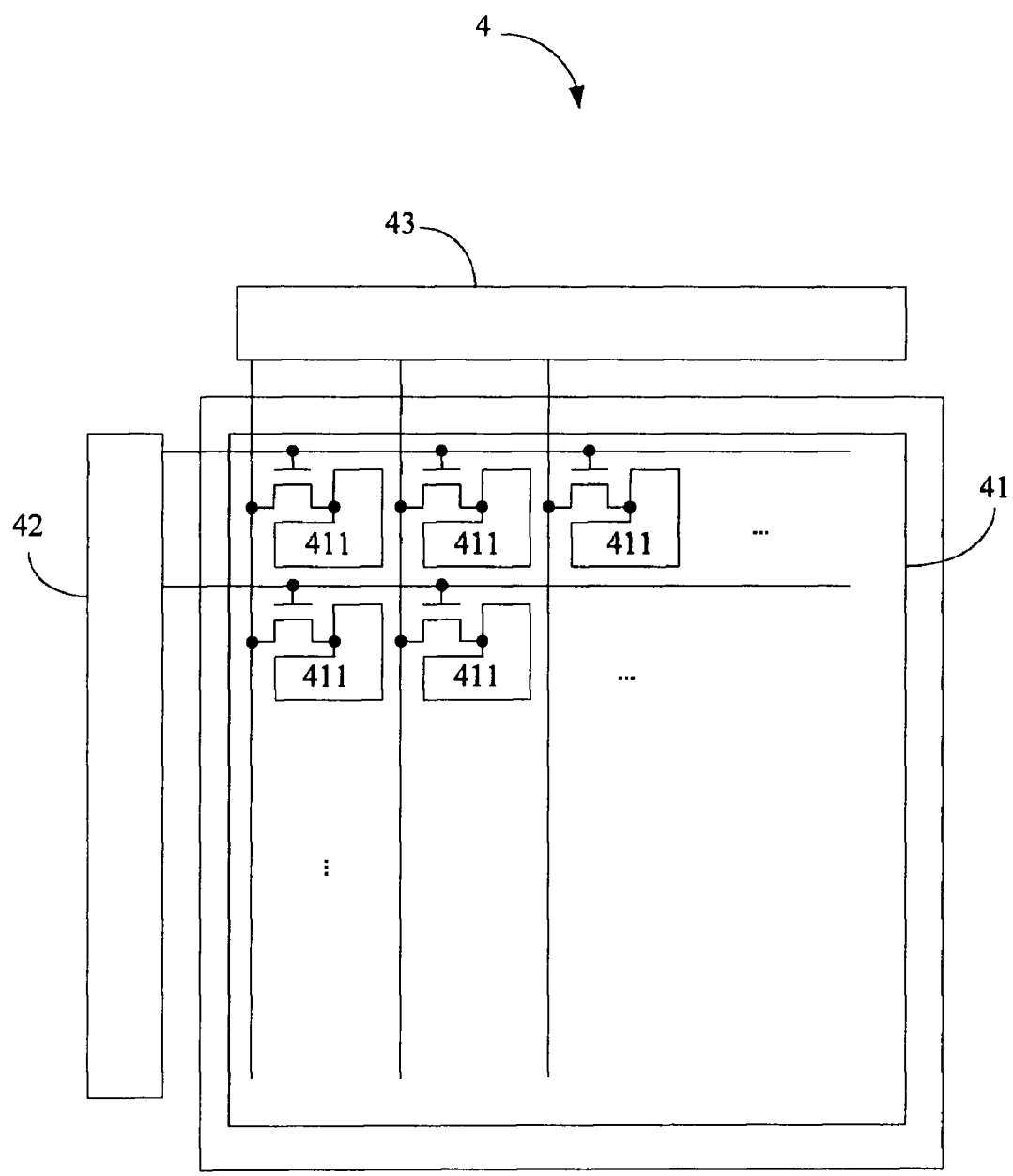
FIG. 4A is a diagram of a display panel of the first embodiment.
Figure 4B:
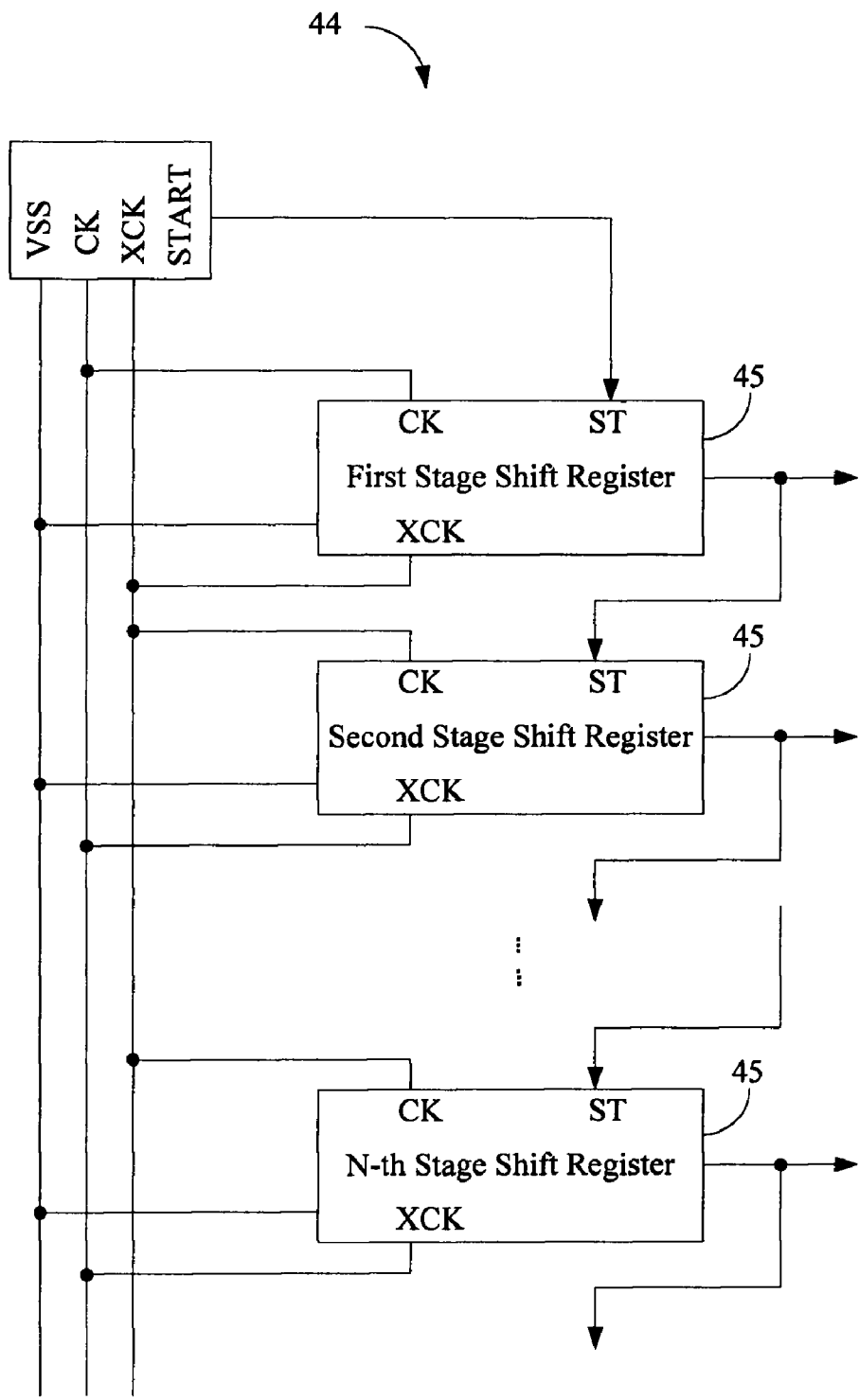
FIG. 4B is a diagram of a shift register array of the first embodiment.

A first embodiment of this invention is a flat display apparatus, such as an LCD. The LCD comprises a display panel 4 as shown in FIG. 4A. The display panel 4 comprises a display array 41, a gate driving circuit 42 and a data driving circuit 43. The display array 41 comprises a plurality of pixels 411. FIG. 4B shows a shift register array 44 comprised in the gate driving circuit 42. The shift register array 44 comprises a plurality of shift registers 45. Each output of these shift registers 45 is coupled to an input of next shift register 45 except the last stage shift register 45. A connection relationship in these shift registers 45 is well known to those skilled in the art and thus is not detailed here. Each of these shift registers 45 is used to drive one row of pixels of the display array. For example, an N-th shift register 45 is used to drive an N-th row of pixels.

Figure 4C:
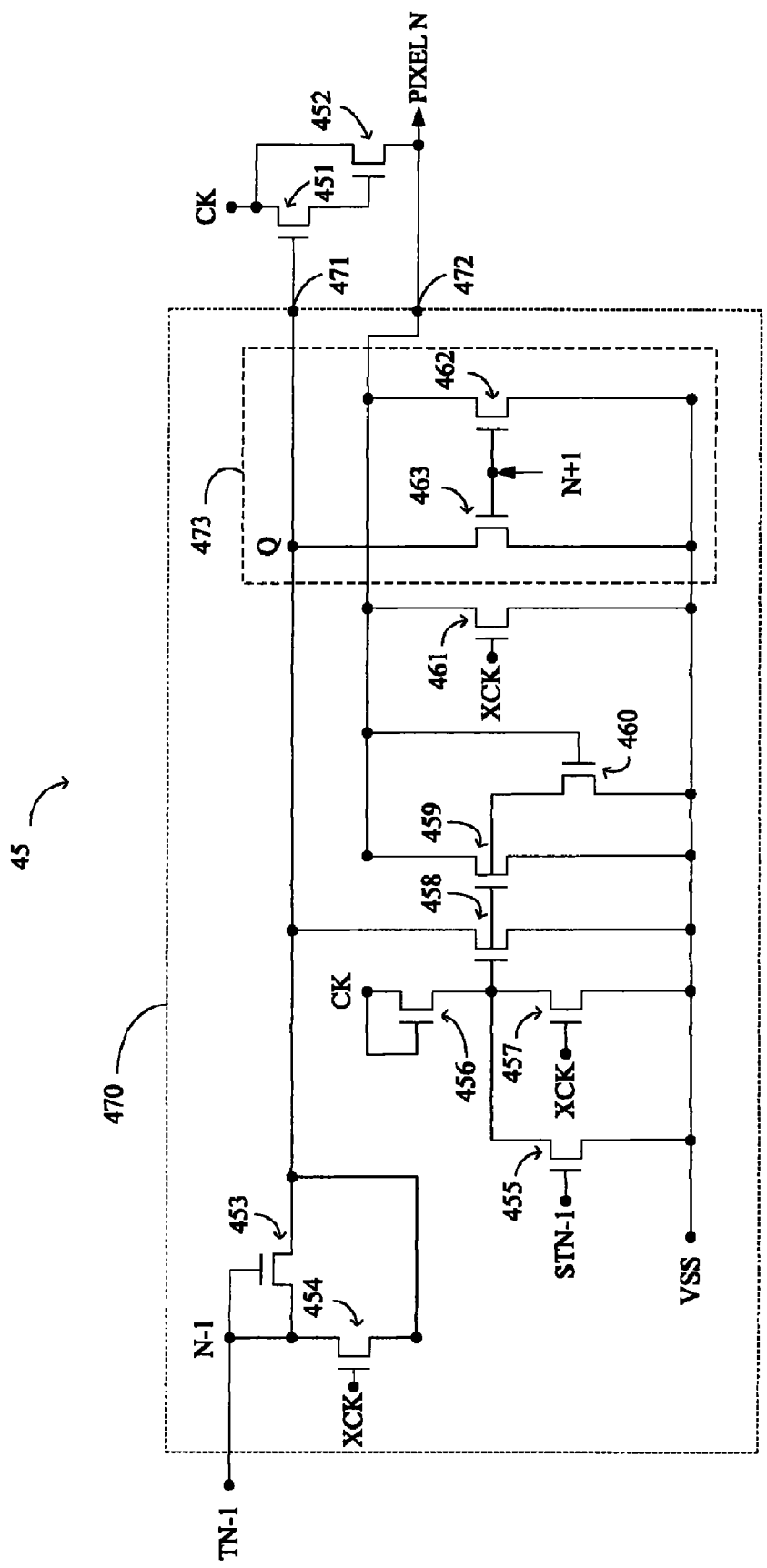
FIG. 4C is a diagram of a shift register of the first embodiment.

In general, a structure for each of the shift registers 45 is the same, but not limited to. However, this invention does not require that the structure of each of the shift registers 45 be the same. FIG. 4C shows the N-th shift register 45 of the first embodiment. The shift register 45 comprises a first TFT 451, a second TFT 452, a third TFT 453, a fourth TFT 454, a fifth TFT 455, a sixth TFT 456, a seventh TFT 457, a eighth TFT 458, a ninth TFT 459, a tenth TFT 460, an eleventh TFT 461, a twelfth TFT 462 and a thirteenth TFT 463. In the figure, STN−1 represents an input signal of the N-th shift register 45, i.e., a signal outputted from the (N−1)th shift register, which corresponds to ST of FIG. 4B. N represents an output of the N-th shift register, CK represents a positive clock signal, and XCK represents a negative clock signal.

In the first embodiment, the third TFT 453, the fourth TFT 454, the fifth TFT 455, the sixth TFT 456, the seventh TFT 457, the eighth TFT 458, the ninth TFT 459, the tenth TFT 460, the eleventh TFT 461, the twelfth TFT 462, and the thirteenth TFT 463 form a shift register unit 470. The shift register unit 470 is configured to receive an activation signal and comprises a first output terminal 471 and a second output terminal 472. The second output terminal 472 is coupled to the N-th row of pixels PIXEL N, and drives the PIXEL N. In addition, the second terminal 472 is coupled to a next shift register 45.

To be more specific, each of the transistors comprises a gate electrode, a first electrode and a second electrode. In this embodiment, the first electrode can be a source electrode and the second electrode can be a drain electrode. The gate electrode of the third TFT 453 receives the input signal STN−1. The gate electrode of the fourth TFT 454 receives the negative clock signal XCK. The first electrode of the fourth TFT 454 is coupled to the first electrode of the third TFT 453. The second electrode of the fourth TFT 454 is coupled to the second electrode of the third TFT 453 and the input signal STN−1. The gate electrode of the fifth TFT 455 receives the input signal STN−1 as well. The first electrode of the fifth TFT 455 is coupled to a power supply VSS. The gate electrode of the sixth TFT 456 receives a positive clock signal CK. The first electrode of the sixth TFT 456 is coupled to the second electrode of the fifth TFT 455. The second electrode of the sixth TFT 456 is coupled to the gate electrode of the sixth TFT 456. The gate electrode of the seventh TFT 457 receives the negative clock signal XCK. The first electrode of the seventh TFT 457 is coupled to the power supply VSS. The second electrode of the seventh TFT 457 is coupled to the second electrode of the fifth TFT 455. The gate electrode of the eighth TFT 458 is coupled to the second electrode of the fifth TFT 455. The first electrode of the eighth TFT 458 is coupled to the power supply VSS. The second electrode of the eighth TFT 458 is coupled to the first electrode of the third TFT 453. The gate electrode of the ninth TFT 459 is coupled to the second electrode of the fifth TFT 455. The first electrode of the ninth TFT 459 is coupled to the power supply VSS. The gate electrode of the tenth TFT 460 is coupled to the second electrode of the ninth TFT 459. The first electrode of the tenth TFT 460 is coupled to the power supply VSS. The second electrode of the tenth TFT 460 is coupled to the second electrode of the fifth TFT 455. The gate electrode of the eleventh TFT 461 receives the negative clock signal XCK. The first electrode of the eleventh TFT 461 is coupled to the power supply VSS. The second electrode of the eleventh TFT 461 is coupled to the second electrode of the ninth TFT 459. The gate electrode of the twelfth TFT 462 receives an output signal N+1 of the next shift register. The first electrode of the twelfth TFT 462 is coupled to power supply VSS. The second electrode of the twelfth TFT 462 is coupled to the second electrode of the ninth TFT 459. The gate electrode of the thirteenth TFT 463 is coupled to the gate electrode of the twelfth TFT 462. The first electrode of the thirteenth TFT 463 is coupled to the power supply VSS. The second electrode of the thirteenth TFT 463 is coupled to the first electrode of the third TFT 453. The twelfth TFT 462 and the thirteenth TFT 463 form a pull down module 473 to keep a node Q at a certain voltage level for a specific time period while a waveform of the node Q rises.

The first output terminal 471 of the shift register unit 470 is the first electrode of the third TFT 453 and the second output terminal 472 is the second electrode of the twelfth TFT 462. Furthermore, the gate electrode of the first TFT 451 is coupled to the first output terminal 471 of the shift register unit 470, i.e. the first electrode of the third TFT 453. The second electrode of the first TFT 451 receives the positive clock signal CK. The gate electrode of the second TFT 452 is coupled to the first electrode of the first TFT 451. The first electrode of the second TFT 452 is coupled to the second output terminal 472 of the shift register unit 470, i.e., the second electrode of the twelfth TFT 462. The second electrode of the second TFT 452 is coupled to the second electrode of the first TFT 451.

In the first embodiment, a channel width of the second TFT 452 is larger than a channel width of the first TFT 451, for example, a ratio between them is 10:1. If the channel width of the second TFT 452 is 12000 μm, the channel width of the first TFT 451 is 1200 μm. Since a parasitic capacitance of the first TFT 451 is smaller than that of the second TFT 452, a coupling effect of the output terminal of the shift register 45 is reduced.

It is important to emphasize that the channel widths for the second TFT 452 and the first TFT 451 are not limited to the mentioned numbers. As long as the channel width of the second TFT 452 is larger than the channel width of the first TFT 451, the object of this invention can be achieved.

Figure 5:
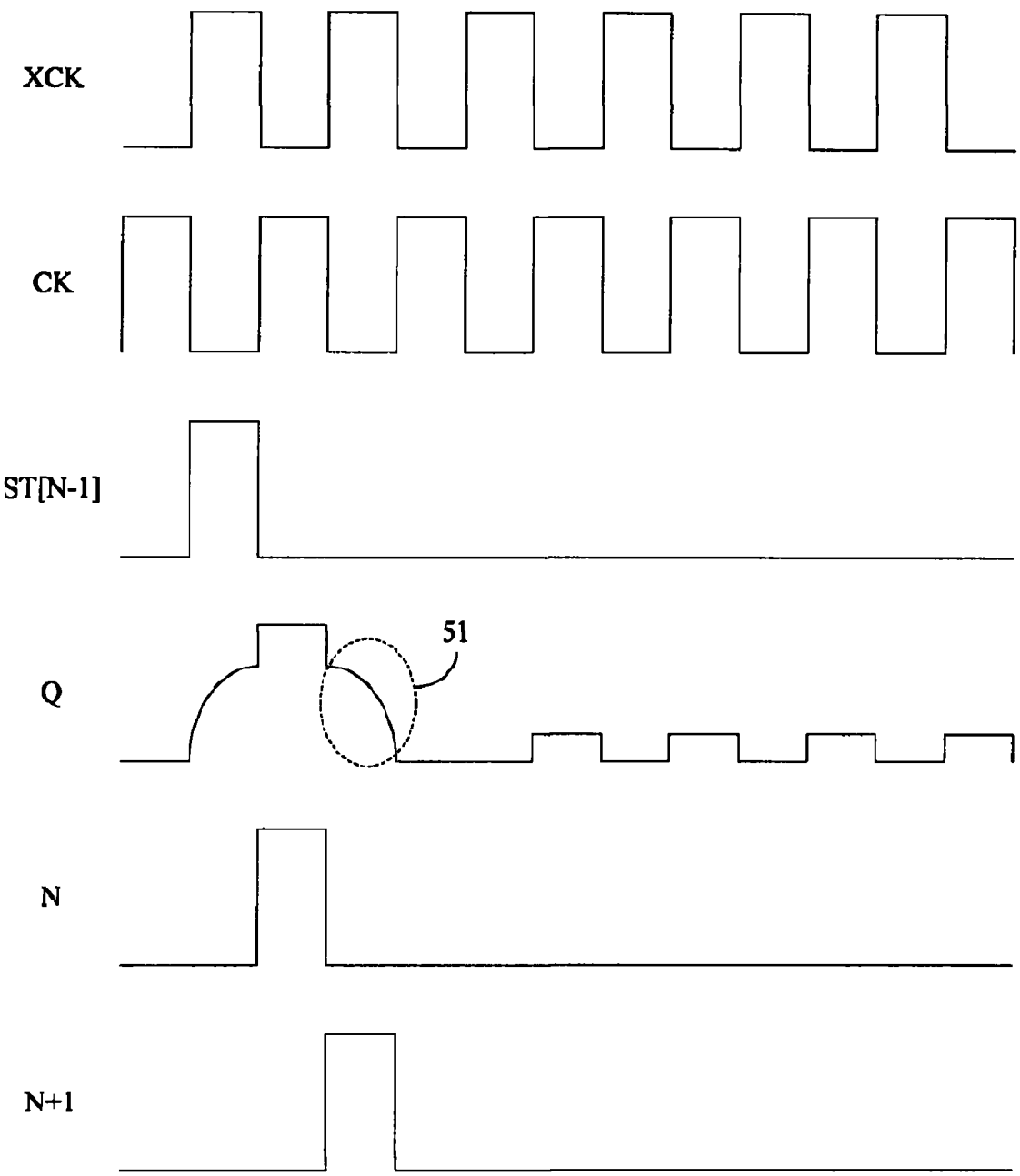
FIG. 5 is a timing diagram of the first embodiment.
Figure 6:
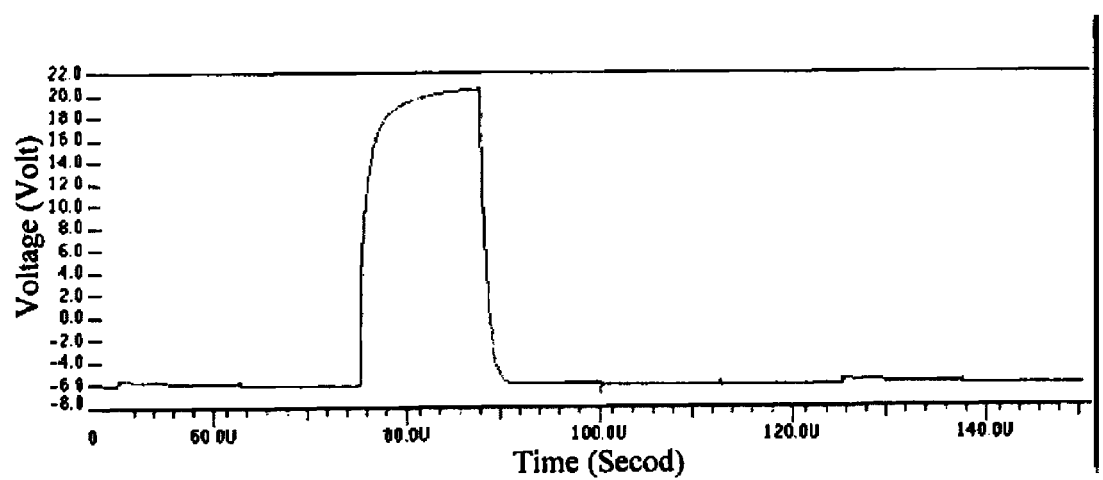
FIG. 6 is a diagram of an output waveform of a shift register of the first embodiment.

FIG. 5 shows a timing diagram of the first embodiment. As shown in the dotted circle 51, when the negative clock signal XCK rises, i.e. the positive clock signal CK falls, some electric charges remain at the node Q, so that the first TFT 451 stays in an activation state to process the output signal PIXEL N continuously, i.e., process a falling portion of the waveform PIXEL N. Consequently, the falling time of the output waveform of first embodiment is shorter. As shown in FIG. 6, the falling time of the output waveform of first embodiment is shorter, which is about 3.9 μs.

Figure 7:
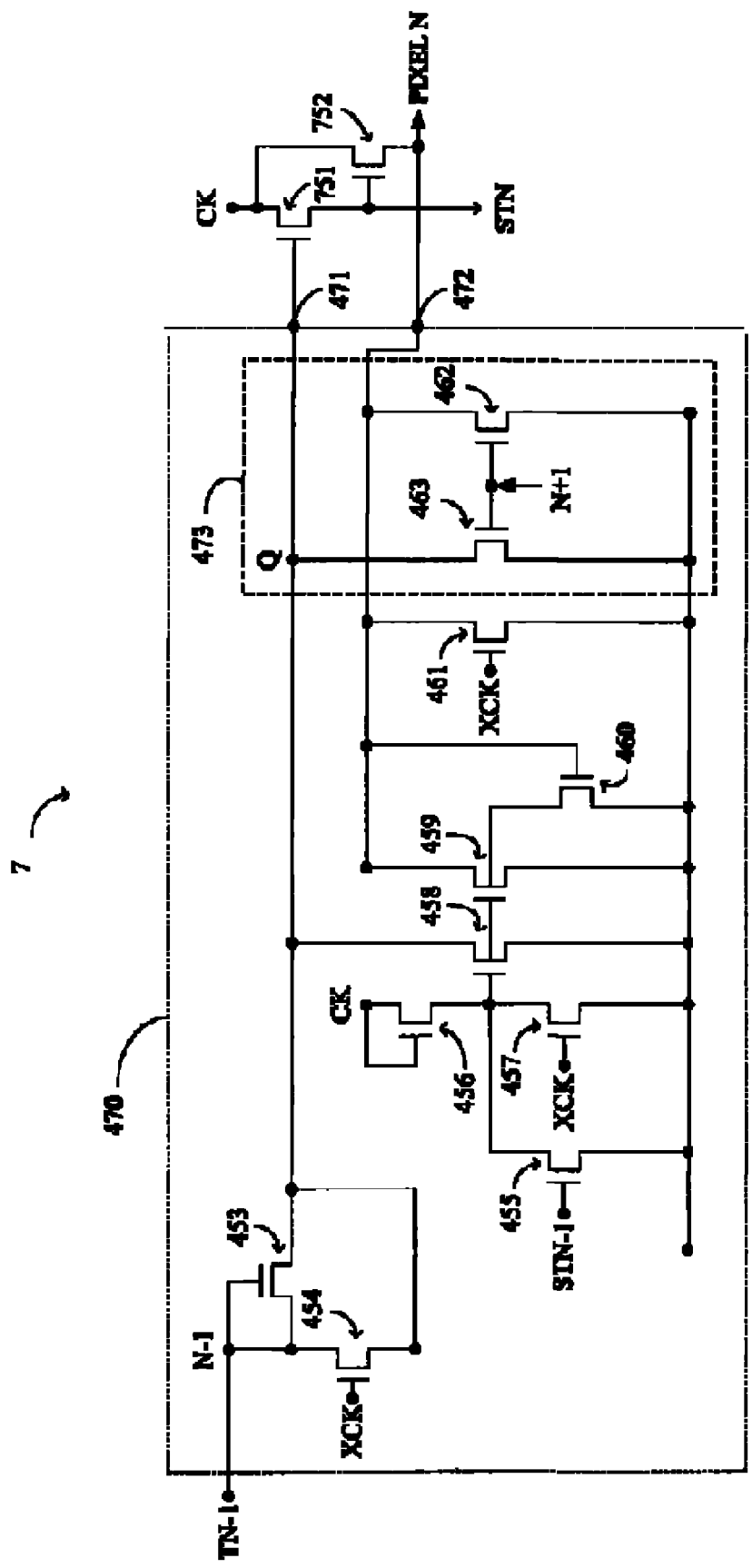
FIG. 7 is a diagram of a shift register of the second embodiment.

FIG. 7 shows a second embodiment of this invention, which is also a shift register. The difference between the first embodiment and the second embodiment is that the first electrode of the first TFT 751 of the shift register 7 in the second embodiment is coupled to the STN, i.e., the ST position of the next shift register, and the first electrode of the second TFT 752 is only coupled to the pixels PIXEL N. The advantage of this configuration is that the operation of the next shift register will not be affected when the second TFT 752 of the shift register or the PIXEL N does not operate normally.

According to the above descriptions, the output terminal of the shift register is properly coupled to two TFTs in this invention. The coupled capacitance is reduced because the size of the first TFT is smaller than the size of the second TFT, which further reduces the possibility of an erroneous operation of a next shift register. Additionally, the pull down module in the invention keeps some electric charges at node Q while the negative clock signal rises, i.e. when the positive clock signal falls, further shortening the falling time of the output waveform. Consequently, a more stable display effect can be achieved with the liquid crystal display apparatus of the invention.

The above disclosure is related to the detailed technical contents and inventive features thereof. Those skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A shift register for driving a row of pixels of a display array, comprising:
    a shift register unit, having a first output terminal and a second output terminal, for receiving an activation signal, the second output terminal being coupled to the row of pixels of the display array;
    a first thin-film transistor (TFT), having a gate, a first electrode, and a second electrode, the gate of the first TFT being coupled to the first output terminal, the second electrode of the first TFT receiving a clock signal; and
    a second TFT, having a gate, a first electrode, and a second electrode, the gate of the second TFT being coupled to the first electrode of the first TFT, the first electrode of the first TFT and gate of the second TFT being not directly coupled to the second output terminal and the second electrode of the second TFT, the first electrode of the second TFT being coupled to the second output terminal, the second electrode of the second TFT being coupled to the second electrode of the first TFT, wherein a channel width of the second TFT is larger than a channel width of the first TFT.

2. The shift register of claim 1, wherein a ratio of a channel width of the second TFT to a channel width of the first TFT is 10:1.

3. The shift register of claim 1, wherein a channel width of the first TFT is 1200 μm and a channel width of the second TFT is 12000 μm.

4. The shift register of claim 1, wherein the first electrode of the first TFT is coupled to a next shift register.

5. The shift register of claim 1, wherein the gate of the second TFT is directly coupled to the first electrode of the first TFT.

6. The shift register of claim 1, wherein the gate of the first TFT is directly coupled to the first output terminal.

7. A shift register array, including a plurality of shift registers connecting in series, each of shift registers being for driving a row of pixels of a display array, at least one of the shift register comprising:
    a shift register unit, having a first output terminal and a second output terminal, for receiving an activation signal, the second output terminal being coupled to the row of pixels of the display array;
    a first TFT, having a gate, a first electrode, and a second electrode, the gate of the first TFT being coupled to the first output terminal, and the second electrode of the first TFT receiving a clock signal; and
    a second TFT, having a gate, a first electrode, and a second electrode, the gate of the second TFT being coupled to the first electrode of the first TFT, the first electrode of the first TFT and gate of the second TFT being not directly coupled to the second output terminal and the second electrode of the second TFT, the first electrode of the second TFT being coupled to the second output terminal and the second electrode of the second TFT being coupled to the second electrode of the first TFT, wherein a channel width of the second TFT is larger than a channel width of the first TFT.

8. The shift register array of claim 7, wherein a ratio of a channel width of the second TFT to a channel width of the first TFT is 10:1.

9. The shift register array of claim 7, wherein a channel width of the first TFT is 1200 μm and a channel width of the second TFT is 12000 μm.

10. The shift register array of claim 7, wherein the first electrode of the first TFT is coupled to a next shift register.

11. A flat display apparatus, comprising:
    a display array, having a plurality of pixels; and
    a shift register array, having a plurality of shift registers, each of the shift registers driving a row of pixels of the display array, at least one of the shift registers comprising:
        a shift register unit, having a first output terminal and a second output terminal, for receiving an activation signal, the second output terminal being coupled to the row of pixels of the display array;
        a first TFT, having a gate, a first electrode, and a second electrode, the gate of the first TFT being coupled to the first output terminal, and the second electrode of the first TFT receiving a clock signal; and
        a second TFT, having a gate, a first electrode, and a second electrode, the gate of the second TFT being coupled to the first electrode of the first TFT, the first electrode of the first TFT and gate of the second TFT being not directly coupled to the second output terminal and the second electrode of the second TFT, the first electrode of the second TFT being coupled to the second output terminal and the second electrode of the second TFT being coupled to the second electrode of the first TFT, wherein a channel width of the second TFT is larger than a channel width of the first TFT.

12. The flat display apparatus of claim 11, wherein a ratio of a channel width of the second TFT to a channel width of the first TFT is 10:1.

13. The flat display apparatus of claim 11, wherein a channel width of the first TFT is 1200 μm and a channel width of the second TFT is 12000 μm.

14. The flat display apparatus of claim 11, wherein the first electrode of the first TFT is coupled to a next shift register.

15. A shift register for driving a row of pixels of a display array, comprising:

a shift register unit, having a first output terminal and a second output terminal, for receiving an activation signal, the second output terminal being coupled to the row of pixels of the display array;

a first thin-film transistor (TFT), having a gate, a first electrode, and a second electrode, the gate of the first TFT being directly coupled to the first output terminal, the second electrode of the first TFT receiving a clock signal; and a second TFT, having a gate, a first electrode, and a second electrode, the gate of the second TFT being directly coupled to the first electrode of the first TFT and being not directly coupled to the second output terminal and the second electrode of the second TFT, the first electrode of the second TFT being coupled to the second output terminal, the second electrode of the second TFT being coupled to the second electrode of the first TFT, wherein a channel width of the second TFT is larger than a channel width of the first TFT.

* * * * *